United States Patent
Augustin et al.

(10) Patent No.: US 6,724,629 B1
(45) Date of Patent: Apr. 20, 2004

(54) LEAF SPRING LOAD PLATE WITH RETAINED LINEAR CAM SLIDE

(75) Inventors: Thomas J. Augustin, El Dorado Hills, CA (US); Stephen D. Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/424,853

(22) Filed: Apr. 29, 2003

(51) Int. Cl.7 .................................................. H05K 7/20
(52) U.S. Cl. ....................... 361/704; 361/707; 361/709; 361/719; 257/718; 257/719; 257/727; 165/80.3; 174/16.3; 24/457; 24/520
(58) Field of Search ................................ 361/704, 709; 257/718, 727; 174/16.3; 165/80.3; 24/520; 248/510

(56) References Cited

U.S. PATENT DOCUMENTS

| | | | |
|---|---|---|---|
| 5,640,302 A | * 6/1997 | Kikinis | ....................... 361/687 |
| 5,870,287 A | * 2/1999 | Rodriguez et al. | .......... 361/704 |
| 6,061,235 A | 5/2000 | Cromwell et al. | |
| 6,198,630 B1 | 3/2001 | Cromwell | |
| 6,330,745 B1 | 12/2001 | Cromwell et al. | |
| 6,515,871 B1 | * 2/2003 | Stark et al. | .................. 361/818 |
| 6,639,800 B1 | * 10/2003 | Eyman et al. | ............... 361/704 |

* cited by examiner

Primary Examiner—Boris Chervinsky

(57) ABSTRACT

An integrated circuit attachment implementation includes a mechanism for inserting and securely holding a replaceable component to an integrated circuit. The mechanism includes a top plate, leaf springs in contact with the top plate, a leaf spring cradle that carries the leaf springs, with the cradle including upper projections that project through corresponding slots in the top plate, a pin inserted through openings in the upper projections, and a linear slide cam located on an upper surface of the top plate between the upper projections and further located below the pin. The cam operates in a first position to transfer a load the replaceable component to securely hold the replaceable component to the integrated circuit and a second position to allow placement of the replaceable component on the integrated circuit.

20 Claims, 5 Drawing Sheets

LEAF SPRING LOAD PLATE WITH RETAINED LINEAR CAM SLIDE

TECHNICAL FIELD

The technical field is integrated circuits, and more particularly attachment implementations used to attach components, such as heat sinks, to printed circuit boards.

BACKGROUND

Current integrated circuit packages are assembled by attaching one or more processors to a printed circuit board or substrate. Assembly may be by soldering electrical components of the processor to the circuit board. Current soldering methods include solder balls placed between the processors and the substrate. More recently, solder columns have been used to attach the processors to the substrate. Other components, such as heat sinks, are then attached to the integrated circuit. Some of these other components are attached using mechanical means. Such mechanical attachments may over stress the solder balls and solder columns, leading to premature failure of the integrated circuit.

The mechanical attachment mechanisms that are used for installation of components onto the substrate may take the form of screws, bolts, or studs that are seated in the substrate, and then turned to operate a metal plate. Turning the screw causes the metal plate to move in a direction along the axis of the screw, compressing the components onto the substrate. However, use of screws and similar devices has many drawbacks. In particular, the application of torque may be highly variable when one human operator turns the screw through more turns than would another human operator. Next, these systems for loading components are complex, require specific tools, take up valuable space in the integrated circuit, and produce metal contamination of the integrated circuit.

SUMMARY

What is disclosed is an attachment implementation for attaching a replaceable component to an integrated circuit. The integrated circuit includes a processor electrically coupled to a circuit board using solder columns. The attachment implementation includes a top plate, leaf springs in contact with the top plate, a leaf spring cradle that carries the leaf springs, with the cradle including upper projections that project through corresponding slots in the top plate, a pin inserted through openings in the upper projections, and a linear slide cam located on an upper surface of the top plate between the upper projections and further located below the pin. The cam has a flat bottom in communication with the upper surface of the top plate. The cam includes a saddle and a valley. The cam operates in a first position with the pin engaged in the valley to apply a spring force to securely hold the replaceable component to the integrated circuit.

Also what is disclosed is an integrated circuit attachment apparatus that includes a replaceable component and a mechanism for inserting and securely holding the replaceable component in the integrated circuit package. The mechanism includes a top plate, leaf springs in contact with the top plate, a leaf spring cradle that carries the leaf springs, with the cradle including upper projections that project through corresponding slots in the top plate, a pin inserted through openings in the upper projections, and a linear slide cam located on an upper surface of the top plate between the upper projections and further located below the pin. The cam operates in a first position to securely hold the replaceable component to the integrated circuit and a second position to allow placement of the replaceable component on the integrated circuit.

Finally, what is disclosed is a device to allow repeatable application of a seating force to seat a component in a circuit. The device includes a top plate having slots and holes, a leaf spring cradle that projects through the slots and that includes holes for receiving a pin, leaf springs that are carried by the cradle, with a top leaf spring contacting an underside of the top plate, and where a spring force moves the cradle away from the top plate, and a linear slide cam that contacts the pin and a top surface of the top plate. The cam includes a first surface that contacts the pin to compress the leaf springs, and a second surface that contacts the pin to decompress the leaf springs. When the leaf springs are decompressed, the spring force is transferred to the component to securely hold the component at the required load.

DESCRIPTION OF THE DRAWINGS

The detailed description will refer to the following drawings, in which like numbers refer to like items, and in which.

DETAILED DESCRIPTION

As the density of elements on a processor increases, new techniques are needed to attach the processor to its underlying substrate or circuit board. In a typical application, the processor may occupy about 42 millimeters square and may have over 1,600 contact points with the underlying circuit board. Solder columns may be used to ensure proper contact between the circuit board and the processor. Solder columns have many advantages over earlier attachment techniques such as solder balls. In particular, solder columns experience less stress due to temperature changes than do solder balls. Reducing stress leads to less fatigue of the solder joint, and a longer life for the assembled circuit board and processor. However, an overload of the solder columns during assembly of the processor and circuit board can buckle the solder columns. Buckling can cause a short if two solder columns touch. Buckling can also cause the solder column to break, causing loss of functions of the processor.

Solder columns can become overloaded by a component under compression seated on the processor. One such component is a heat sink, which is needed to remove heat from the processor. To ensure optimum performance of the heat sink, the heat sink must be in firm contact with the underlying processor. However, as force is applied to the heat sink to ensure it is tightly seated, the solder columns, which are located between the circuit board and the processor, are subjected to a compressive force that can buckle the solder columns over time, causing shorts or opens, as noted above.

Figure 1:
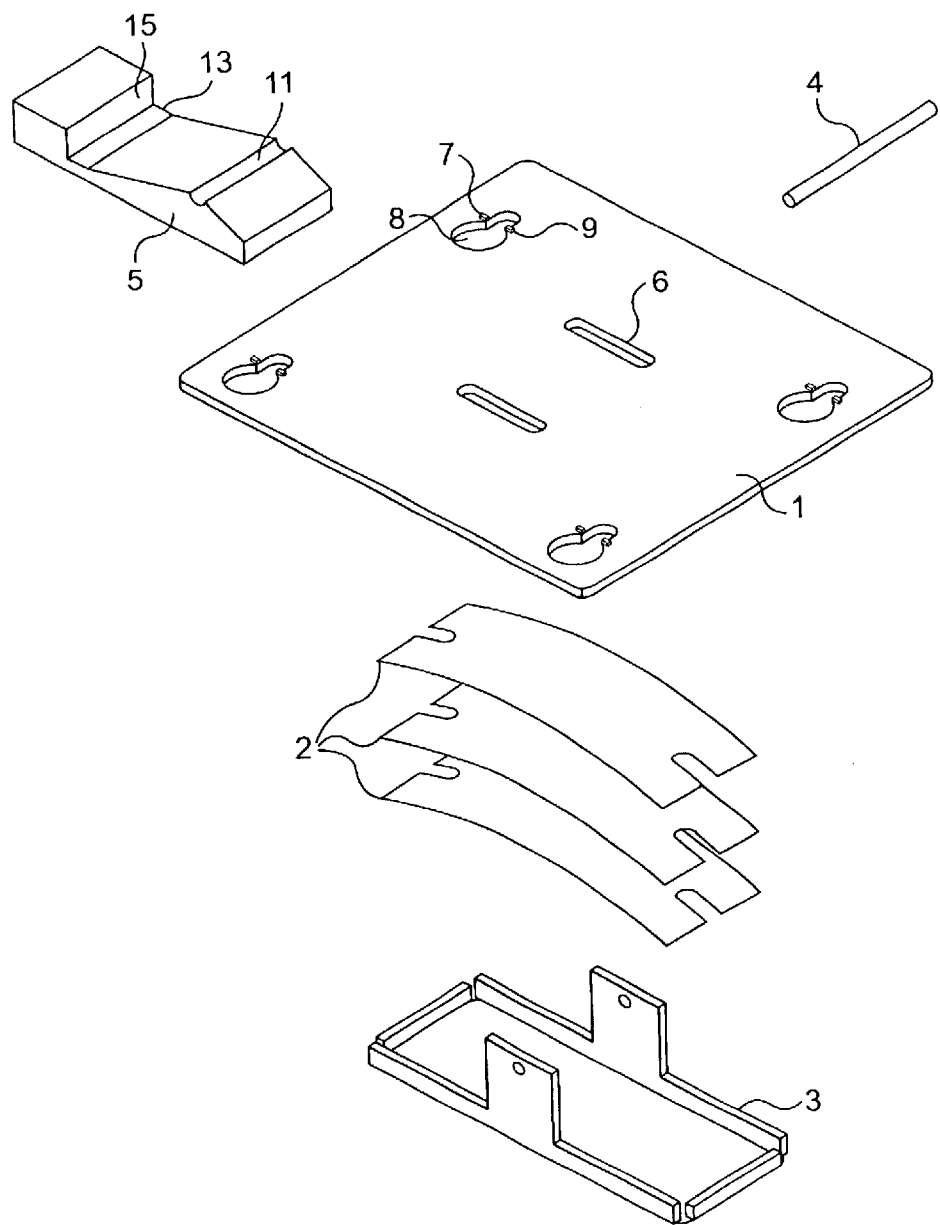
FIG. 1 is an exploded view of components of an embodiment of a leaf spring load plate with retained linear cam.

FIG. 1 is an exploded view of components of an embodiment of a leaf spring load plate 10 with retained linear cam that eliminates problems with prior art techniques for attaching a heat sink or similar component to a substrate. In FIG. 1, the leaf spring load plate 10 includes a top plate 1, having slots 6 and keyed holes 7 as shown, leaf springs 2, leaf spring cradle 3 that holds the leaf springs 2, and that protrudes through the slots 6 in the top plate 1, pin 4, and linear cam slide 5. The top plate 1 and the leaf spring cradle 3 may be made of sheet steel. The leaf springs 2 are preferably made of hardened or heat treated stainless steel. The pin 4 is made of mild steel. The linear cam slide 5 is preferably made of molded plastic. The linear cam slide 5 is formed in such a manner that lateral movement of the linear cam slide 5 compresses or decompresses the leaf springs 2. In particular, the linear cam slide 5 includes a saddle 11, valley 13, and end stop 15. The saddle 11 is shaped to accept the pin 4. When the pin 4 is aligned over the saddle 11, the leaf springs 2 are in a maximum compressive state, and no force is applied to hold the heat sink to its underlying processor (i.e., the load plate 10 is loosely attached). When the pin 4 is aligned over the valley 13, the leaf springs 2 push the leaf spring cradle 3, seating the heat sink on the processor.

Although FIG. 1 shows three leaf springs 2, the number of leaf springs 2 is not limited to three. More leaf springs 2 may be added to increase the downward force holding the heat sink to the circuit board; fewer than three leaf springs 2 will result in a decreased downward force holding the heat sink to the processor.

Figure 2A:
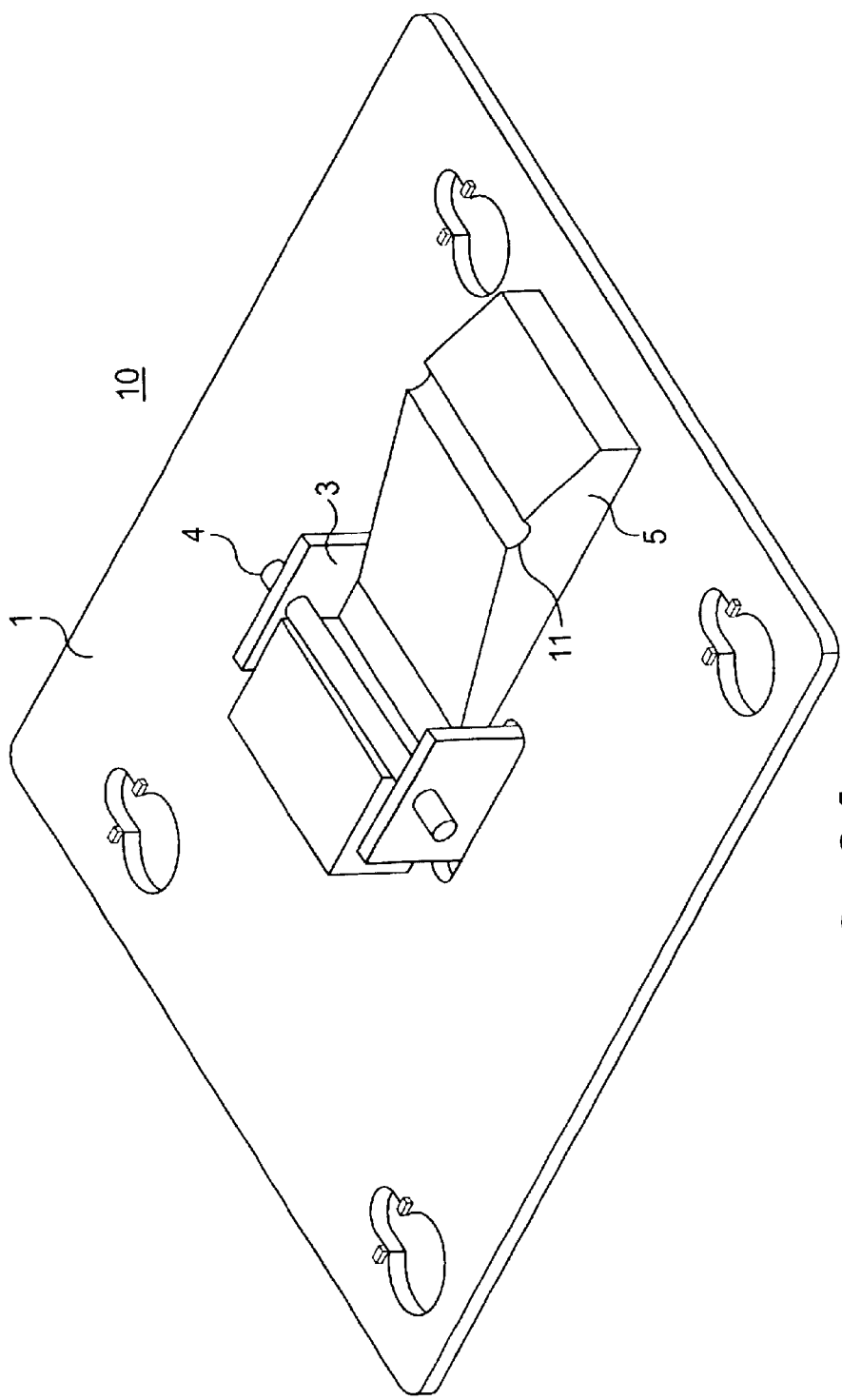
FIGS. 2A and 2B shows the load plate assembled.

FIG. 2A shows the load plate 10 assembled. As can be seen in FIG. 2A, the ears of the leaf-spring cradle 3 project through the slots 6 in the top plate 1, and carry the pin 4. The linear cam slide 5 is shown in a first position with the valley 13 aligned under the pin 4.

Figure 2B:
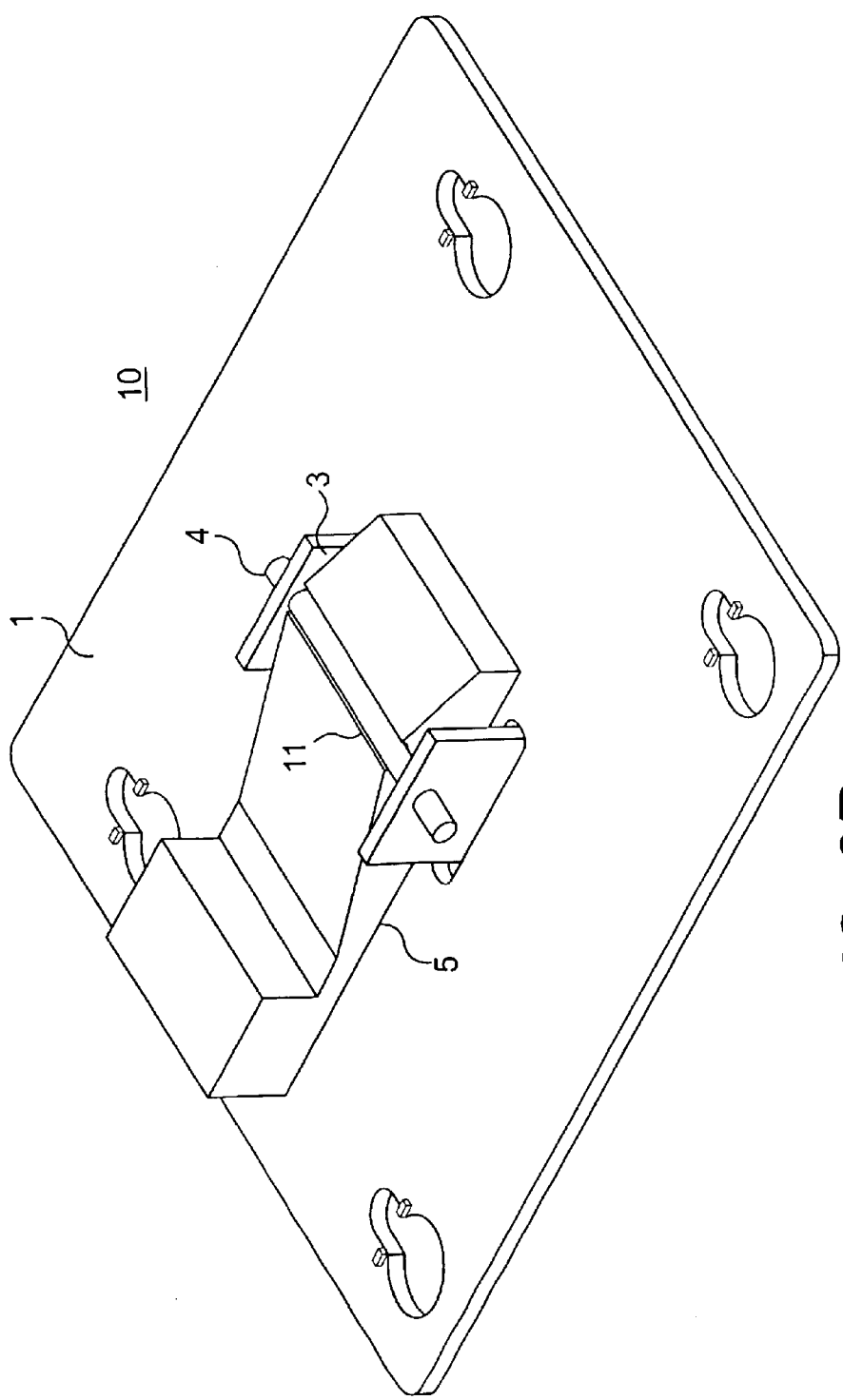

FIG. 2B shows the load plate 10 assembled, but with the linear cam slide 5 in a second position. In the second position, the pin 4 engages the saddle 11.

Figure 3:
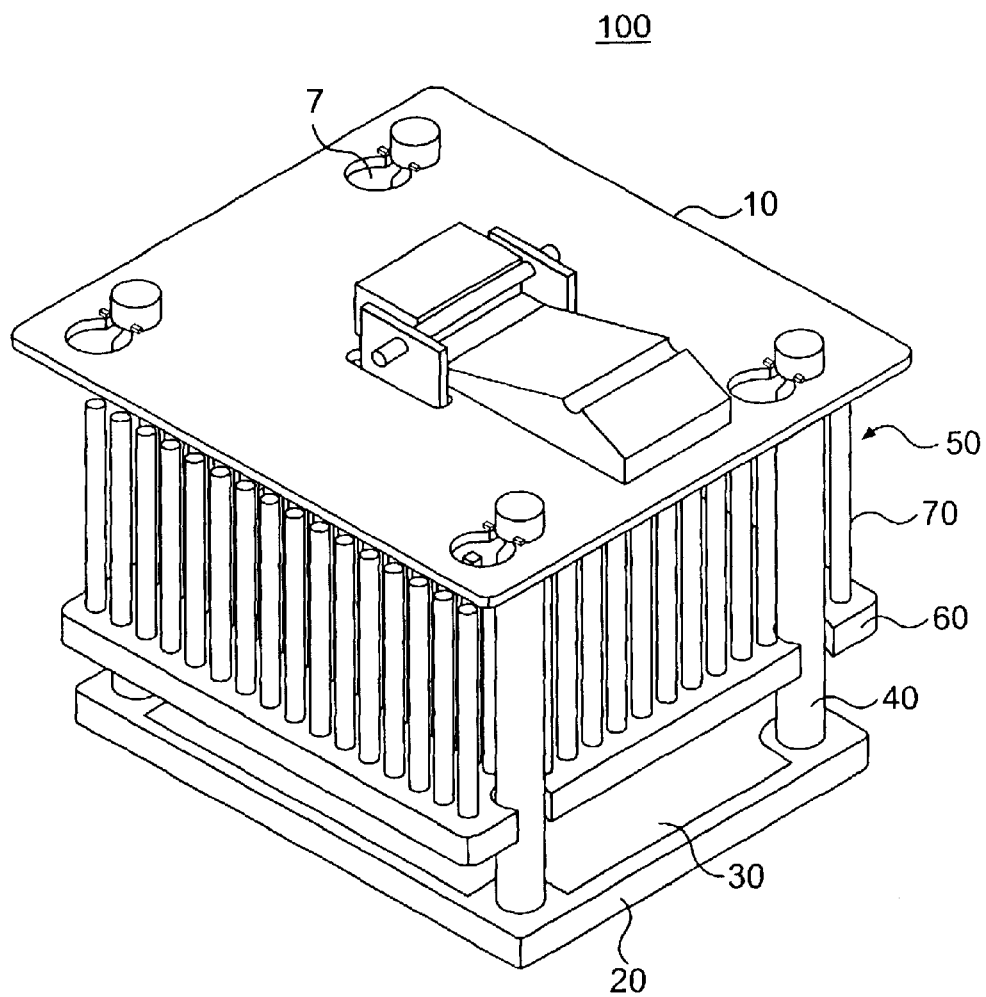
FIG. 3 shows the assembled load plate used to install a heat sink on an integrated circuit.

FIG. 3 shows an attachment implementation 100 using the load plate 10 installed to provide optimal thermal performance without damaging the solder columns between processor and circuit board. In FIG. 3, the attachment implementation 100 includes bolster plate 20, insulator 30, load studs 40, and heat sink 50. The heat sink 50 includes heat sink base 60, and heat sink columns 70. The load plate 10 is assembled to the load studs 40 using keyed holes 7. The linear cam slide 5 is shown in position to seat the heat sink 50 onto the circuit board (not shown In FIG. 3). Located between the insulator 30 and the heat sink base 60 is a modular processor and the circuit board.

Figure 4:
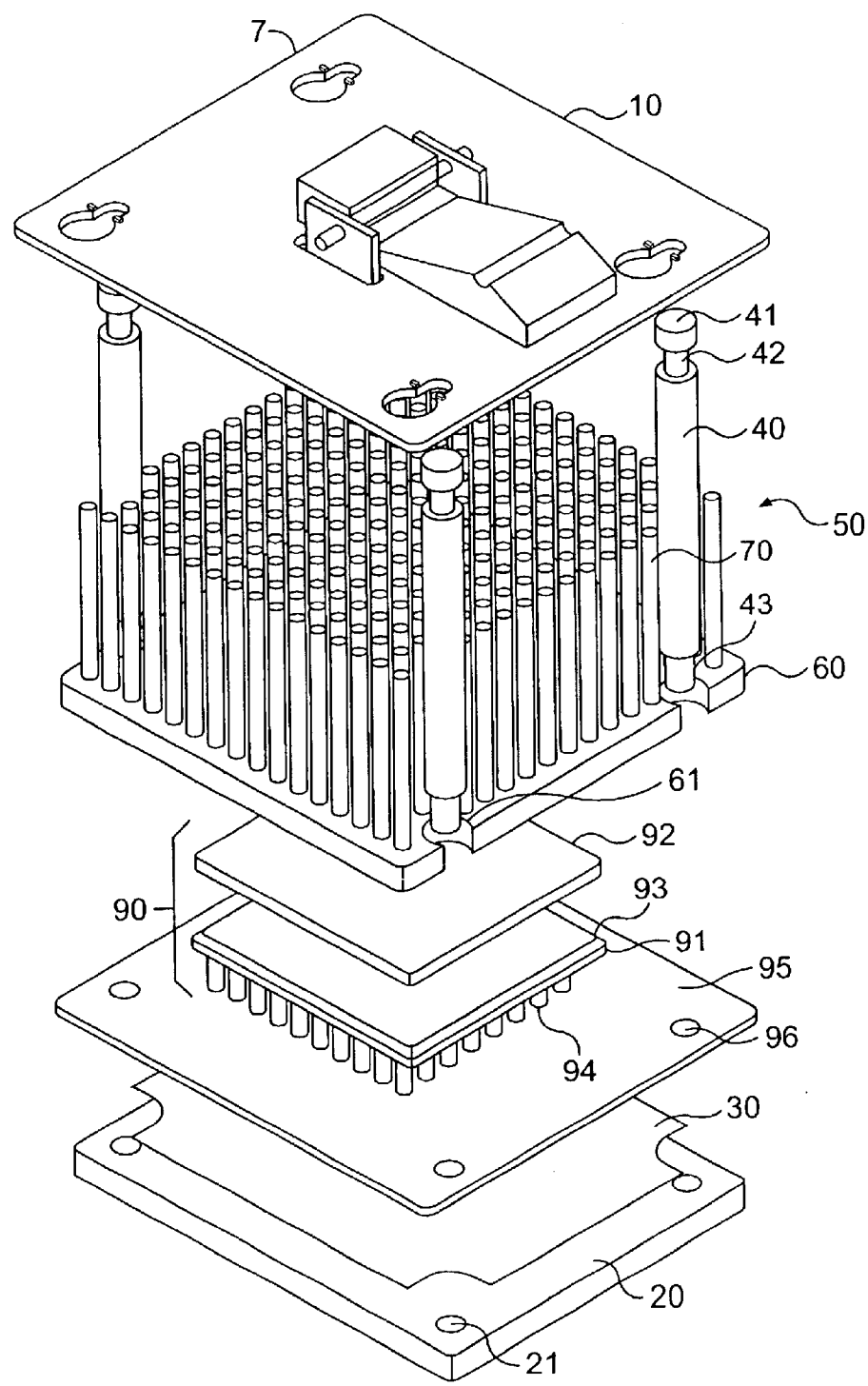
FIG. 4 shows details of the load plate and the integrated circuit of FIG. 3.

FIG. 4 shows additional details of the integrated circuit package 100 of FIG. 3. A modular processor 90 and a circuit board 95 are located between the bolster plate 20 and the heat sink 50. The modular processor 90 may be an integrated circuit module such as, for example, a multi-chip module or a single very large scale integrated (VLSI) package. The VLSI package may be a flip chip assembly. The modular processor 90 may also be an application specific integrated circuit (ASIC). The circuit board 95 may be, for example, a printed circuit board such as a mother board. Only a section of the circuit board 95 is shown in FIG. 4.

Referring to FIGS. 3 and 4, the bolster plate 20 is set on a bottom surface of the insulator 30. The bolster plate 20 may be attached to the circuit board 95. The bolster plate 20 includes sockets 21 located along a perimeter of the bolster plate 20 and adapted to receive the load studs 40. In an embodiment, the sockets 21 are threaded, and the load studs 40 thread into the threaded sockets 21. The circuit board 95 is formed with holes 96 corresponding to the locations of the sockets 21 in the bolster plate 20. The insulator 30 is set over the bolster plate 20 in between the bolster plate 20 and the circuit board 95. The insulator 30 insulates between input/output (I/O) pads (not shown) that are located on the bottom surface of the circuit board 95, and the bolster plate 20, which is conductive. The insulator 30 prevents short circuiting between the I/O pads through the bolster plate 20.

The modular processor 90 sits on a top surface of the circuit board 95 over the bolster plate 20. The modular processor 90 includes processor 91, thermal interface material (TIM) 92, processor lid 93, and solder columns 94. The TIM 92 uses a thermal interface enhancement material for enhancing thermal conduction from the processor 20 to the heat sink 50. The TIM 92 is set on a top face of the processor 91. The solder columns 94 provide electrical connection between the processor 91 and the circuit board 95. To establish and maintain a reliable thermal connection between the processor 91 and the heat sink 50, the solder columns 94 must bear the compressive load between the circuit board 95 and the processor 91 without overloading the solder columns 91.

As noted above, the load studs 40 may thread into the bolster plate 20. Alternatively, the load studs 40 may be pressed into the bolster plate 20. Each load stud 40 includes a head 41, a top shoulder 42 and a bottom shoulder 43. Each load stud 40 bottoms out on the top surface of the bolster plate 20 on the shoulder 43.

The heat sink 50 is set over the load studs 40 through holes 61 located along a perimeter of the heat sink base 60. The holes 61 correspond to the location of the sockets 21 in the bolster plate 20. The heat sink 50 is located on top of and in contact with the modular processor 90. The heat sink 50 includes extruded, or otherwise formed, columns 70 that provide a surface area for distributing heat generated by the processor 91. Although the columns 70 are shown as cylinders, the columns 70 are not restricted to this configuration, and may also be square in cross-section, for example. Heat that is generated in processor 91 may be thermally conducted into the heat sink 50 and further conducted into the ambient airflow by the columns 70 to dissipate the heat. The heat sink 50 may, for example, be formed from aluminum.

The load plate assembly 10 is set above the heat sink 50 and shuttled onto the load studs 40 through the holes 7 in the load plate assembly 10. The load plate assembly 10 may be lowered onto the load studs 40 through the wide opening 8 of each hole 7 and then shuttled laterally so that the narrow slot 9 of each hole 7 is placed between the head 41 and the top shoulder 42 of each load stud 40. The locations of the holes 7 correspond to the locations of the sockets 21 in the bolster plate 20.

As noted above with respect to FIGS. 1 and 2A, the load plate assembly 10 may include one or more leaf springs 2 carried in the leaf spring cradle 3. The leaf springs 2 are concave in shape and are oriented so that the concavity faces the inner top surface of the leaf spring cradle 3. The bottom surface of the leaf spring cradle 3 contacts tops of a number of the heat sink columns 70. With the linear cam slide 5 positioned in the valley 13 as shown, the load created by the leaf springs 2 forces the leaf spring cradle 3 onto the tops of the heat sink columns 70. The resulting force acts through the load plate 10 and the load studs 40 onto the bolster plate 20, drawing the heat sink 50 into firm contact with the modular processor 90.

The use of the leaf spring load plate 10 provides significant advantages over prior art designs. The leaf spring load plate 10 is particularly useful in integrated circuit packages when the applied load must be kept at a low value, and must be controlled to a tight tolerance, on the order of 10 to 16 pounds of force in one implementation. However, as noted above, the actual loading will be affected by the number of leaf springs 2 used in the attachment implementation 100. The actual loading will also be affected by the distance between the bottom of the leaf spring load plate 10 and the top of the heat sink 50. The leaf spring load plate 10 allows components to be installed and removed from the integrated circuit. More importantly, the leaf spring load plate 10 allows a controlled application of force to a component to be mounted to the integrated circuit, and eliminates variability in applied force due to human factors. That is, by adjusting the number of leaf springs 2 in the assembled leaf spring load plate 10, a specific, repeatable force is guaranteed to be applied. Because there are no screws to turn, bolts to torque, or other mechanical operations for a human to complete, the leaf spring load plate 10 will always apply the desired force when the linear cam slide 5 is moved from a position in which the pin 4 rests on the saddle 11 to the valley 13, thereby allowing the leaf springs 2 to exert a downward force on the leaf spring cradle 3. In addition, by having the force applied on the tops of the heat sink columns 70, the heat sink 50 retains all its originally extruded heat sink columns, thereby maximizing heat rejection. Still another advantage resides in the fact that by eliminating turning screws and bolts, metal debris are not generated during installation and setting of the heat sink.

We claim:

1. An attachment implementation for attaching a replaceable component to an integrated circuit, the integrated circuit including a processor electrically coupled to a circuit board using solder columns, the attachment implementation, comprising:

a top plate;

leaf springs in contact with the top plate;

a leaf spring cradle that carries the leaf springs, the cradle comprising upper projections that project through corresponding slots in the top plate;

a pin inserted through openings in the upper projections; and a linear slide cam located on an upper surface of the top plate between the upper projections and further located below the pin, the cam having a flat bottom in communication with the upper surface of the top plate, the cam, comprising:

a saddle, and a valley, wherein the cam operates in a first position with the pin engaged in the valley to apply a load to securely hold the replaceable component to the integrated circuit.

2. The attachment implementation of claim 1, wherein the cam operates in a second position with the pin engaged on the saddle to remove the load.

3. The attachment implementation of claim 1, wherein the leaf springs comprise three spring elements.

4. The attachment implementation of claim 3, wherein a number of spring elements is variable to increase or decrease the spring force with the cam in the first position.

5. The attachment implementation of claim 1, wherein the cam is formed from a moldable plastic material.

6. The attachment implementation of claim 1, wherein the replaceable component is a heat sink, wherein the heat sink is in communication with the processor.

7. The attachment implementation of claim 6, wherein with the cam in the first position, a bottom surface of the cradle contacts the heat sink to securely hold the heat sink to the integrated circuit.

8. An integrated circuit attachment apparatus, comprising:
   a replaceable component; and
   a mechanism for inserting and securely holding the replaceable component to the integrated circuit, comprising:

a top plate, leaf springs in contact with the top plate, a leaf spring cradle that carries the leaf springs, the cradle comprising upper projections that project through corresponding slots in the top plate, a pin inserted through openings in the upper projections, and a linear slide cam located on an upper surface of the top plate between the upper projections and further located below the pin, wherein the cam operates in a first position to securely hold the replaceable component to the integrated circuit and operates in a second position to allow placement of the replaceable component on the integrated circuit.

9. The apparatus of claim 8, wherein operation of the cam between the first position and the second position compresses the leaf springs.

10. The apparatus of claim 8, wherein the cradle contacts the replaceable component, and wherein when the cam is in the first position, spring force from the leaf springs securely holds the replaceable component in the integrated circuit package.

11. The apparatus of claim 8, wherein the leaf springs comprise three spring elements.

12. The apparatus of claim 11, wherein a number of spring elements is variable to increase or decrease the spring force with the cam in the first position.

13. A device to allow repeatable application of a seating force to seat a component in a circuit, comprising:

a top plate having slots and holes;

a leaf spring cradle that projects through the slots and that includes holes for receiving a pin;

leaf springs that are carried by the cradle, wherein a top leaf spring contacts an underside of the top plate, and wherein spring force moves the cradle away from the top plate; and a linear slide cam that contacts the pin and a top surface of the top plate, the cam, comprising:

a first surface that contacts the pin to compress the leaf springs, and a second surface that contacts the pin to decompress the leaf springs, wherein when the leaf springs are decompressed, the seating force is transferred to securely seat the component.

14. The device of claim 13, wherein the seating force varies between 10 and 16 pounds of force.

15. The device of claim 13, wherein the leaf springs comprise three spring elements.

16. The device of claim 13, wherein the leaf springs comprise more than three spring elements, wherein the seating force exceeds 16 pounds of force.

17. The device of claim 13, wherein the component is a heat sink, wherein the seating force provides a required thermal interface between the heat sink and the circuit.

18. The device of claim 13, wherein the cam further comprises a stop to retain the cam between the pin and plate.

19. The device of claim 13, wherein the cradle is formed from sheet metal.

20. The device of claim 13, wherein the leaf springs are formed from stainless steel.

* * * * *